United States Patent
Schnabel et al.

(10) Patent No.: US 6,850,448 B2
(45) Date of Patent: Feb. 1, 2005

(54) TEMPERATURE-DEPENDENT REFRESH CYCLE FOR DRAM

(75) Inventors: Joachim Schnabel, Munich (DE); Michael Sommer, Raubling (DE)

(73) Assignee: Infineon Technologies AG, Munich (DE)

(*) Notice: Subject to any disclaimer, the term of this patent is extended or adjusted under 35 U.S.C. 154(b) by 24 days.

(21) Appl. No.: 10/386,148

(22) Filed: Mar. 11, 2003

(65) Prior Publication Data

US 2003/0214858 A1 Nov. 20, 2003

(30) Foreign Application Priority Data

Mar. 28, 2002 (DE) ......................... 102 14 103

(51) Int. Cl.[7] .............................................. G11C 7/04
(52) U.S. Cl. ....................... 365/211; 365/212; 365/222
(58) Field of Search ................................ 365/191, 211, 365/212, 222

(56) References Cited

U.S. PATENT DOCUMENTS

| | | | | |
|---|---|---|---|---|
| 5,278,796 A | * | 1/1994 | Tillinghast et al. | 365/211 |
| 5,495,452 A | * | 2/1996 | Cha | 365/222 |
| 5,499,214 A | * | 3/1996 | Mori et al. | 365/222 |
| 5,680,359 A | * | 10/1997 | Jeong | 365/211 |
| 5,691,661 A | * | 11/1997 | Fukuda et al. | 365/222 |
| 6,191,660 B1 | | 2/2001 | Mar et al. | 331/111 |
| 6,404,690 B2 | | 6/2002 | Johnson et al. | 365/222 |

FOREIGN PATENT DOCUMENTS

DE 100 21 085 4/2000 ......... G11C/11/406

OTHER PUBLICATIONS

Cai et al., "High Precision Voltage–to–Frequency Converter", IEEE, pp. 1141–1144.
U. Tietz and Ch. Schenk "Halbleiter–Schaltungstechnik", 10th ed. pp. 558–561 and pp. 896–899.

* cited by examiner

Primary Examiner—Son Mai
(74) Attorney, Agent, or Firm—Fish & Richardson, PC

(57) ABSTRACT

A circuit for generating a refresh signal for a memory cell, includes a temperature-independent current source, a temperature-independent voltage source, and a temperature-dependent reference voltage source. A capacitor's first and second terminals are connected respectively to the temperature-independent current source, and the temperature-independent voltage source. The capacitor's first terminal is connected to a first input terminal of a comparator. The comparator's second input is connected to the temperature-dependent reference voltage source. The comparator is configured to output a refresh signal in response to a difference between voltages present at the first and second inputs thereof.

16 Claims, 1 Drawing Sheet

TEMPERATURE-DEPENDENT REFRESH CYCLE FOR DRAM

RELATED APPLICATIONS

This application claims the benefit of the Mar. 28, 2002 priority date of German application DE 10214103.7.

BACKGROUND

DRAMs or dynamic semiconductor memories comprise a multiplicity of memory cells in order to store information. The memory cells of a DRAM can retain their information only for a specific time on account of unavoidable leakage currents and parasitic processes. For this reason, a refresh must be carried out at specific time intervals.

Devices for generating a refresh signal for a memory cell of a semiconductor memory device are known which periodically generate a refresh signal and output it to a refresh device for refreshing the memory cell. However, these devices have the disadvantage that the refresh frequency or refresh period is the same for all operating temperatures of the semiconductor memory device, and, consequently, in particular at low temperatures, for which a lower refresh frequency suffices, a refresh signal is output more often than necessary and, consequently, current is consumed unnecessarily by the semiconductor memory device.

SUMMARY

For this reason, it is an object of the present invention to provide a device and a method for generating a refresh signal for a memory cell of a semiconductor memory device which make it possible to control the period duration of a refresh signal in a manner dependent on the temperature.

The present invention provides a device for generating a refresh signal for a memory cell of a semiconductor memory device; the device comprising:

a temperature-independent or constant current source for providing a current having a predeterminable temperature-independent or constant current intensity;

a temperature-independent or constant voltage source for providing a predeterminable temperature-independent or constant voltage potential;

a temperature-dependent reference voltage source for providing a temperature-dependent reference voltage potential;

a capacitor, whose first capacitor electrode, for charging the capacitor, is electrically connected to the temperature-independent current source, and whose second capacitor electrode is electrically connected to the temperature-independent voltage source; and a comparator, whose first comparator input is electrically connected to the first capacitor electrode and whose second comparator input is connected to the temperature-dependent voltage source, the comparator being designed for a voltage comparison between the capacitor voltage potential present at the capacitor and the reference voltage potential, and, if the capacitor voltage potential exceeds the reference voltage potential, for outputting the refresh signal.

The refresh signal triggers, in the semiconductor memory device, a refresh or an updating of the memory cell or the memory cell array.

What can be achieved by the virtue of the fact that the comparator compares the capacitor potential with a temperature-dependent reference potential is that the refresh signal output by the comparator is likewise temperature-dependent.

Through suitable processing or amplification of the temperature-dependent reference potential and suitable setting of the temperature-independent voltage potential, it is possible to achieve a virtually arbitrary adaptation of the period duration of the refresh signal to the temperature.

In a preferred embodiment, the device furthermore comprises a switch for resetting the capacitor. The switch is preferably kept closed until the capacitor has completely discharged. However, it is also conceivable for the capacitor not to be completely discharged and for the capacitor voltage to be lowered only down to a value which lies below the reference voltage.

Preferably, the switch is in signal connection with the comparator in such a way that the capacitor is reset when the refresh signal is output.

Preferably, the reference voltage source furthermore comprises an impedance converter and preferably an inverting amplifier for amplifying the reference voltage potential.

Preferably, the temperature-independent voltage source comprises an impedance converter for generating the temperature-independent voltage potential.

Preferably, the temperature-dependent reference voltage source comprises a device for converting a temperature-dependent current, preferably a current of a bandgap circuit of the semiconductor memory device, into a temperature-dependent voltage potential, and the reference voltage potential is able to be generated by the temperature-dependent current.

The memory cell is preferably a DRAM memory cell.

The present invention furthermore provides a method for generating a refresh signal for a memory cell of a semiconductor memory device, the method comprising the following steps:

setting of a temperature-independent or constant voltage potential of a second capacitor electrode of a capacitor, preferably by means of a temperature-independent or constant voltage source;

charging of the capacitor by means of a current having a predeterminable temperature-independent or constant current intensity via a first capacitor electrode;

comparison of the capacitor voltage potential present at the first capacitor electrode with a temperature-dependent reference voltage potential by means of a comparator; and outputting of a refresh signal by the comparator if the capacitor voltage potential exceeds the reference voltage potential.

Preferably, the method according to the invention furthermore comprises a step of resetting of the capacitor, the resetting step being effected essentially at the same time as the step of outputting of the refresh signal.

BRIEF DESCRIPTION OF THE DRAWINGS

Further objects, features and advantages of the present invention will become apparent from the exemplary description of a preferred embodiment with reference to the drawing, in which.

DETAILED DESCRIPTION

Figure 1:
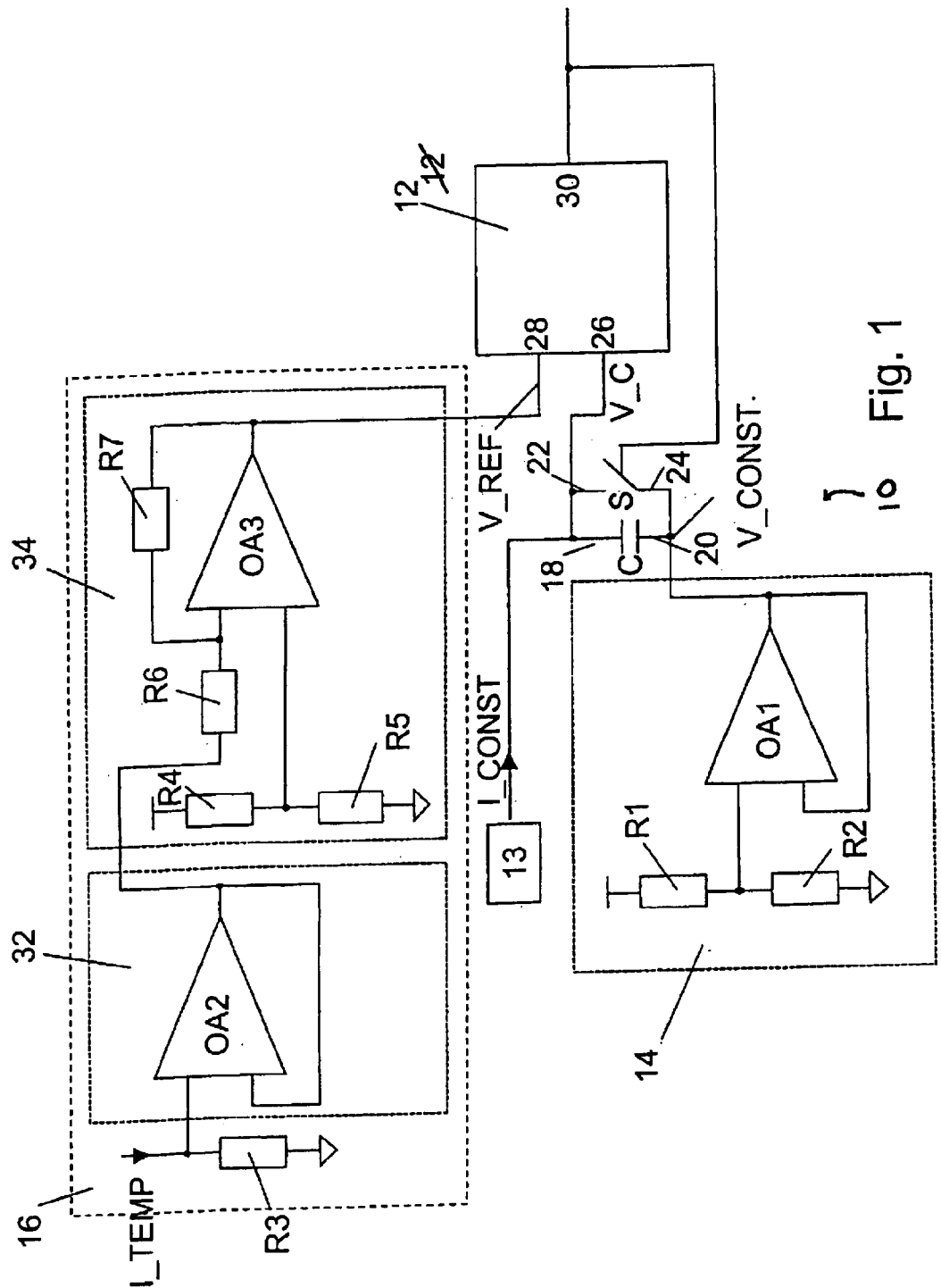
FIG. 1 shows a schematic block diagram of a device in accordance with a preferred embodiment of the present invention.

A device in accordance with a preferred embodiment of the invention is described with reference to FIG. 1.

FIG. 1 shows a schematic view of a device in accordance with a preferred embodiment of the present invention.

The device 10 according to the invention comprises a capacitor C, a switch S and a comparator 12. Furthermore, the device comprises a temperature-independent or constant current source 13 for providing a current having a predeterminable temperature-independent current intensity I_CONST and a temperature-independent or constant voltage source 14 for providing a predeterminable temperature-independent voltage potential V_CONST. Furthermore, the device 10 according to the invention comprises a temperature-dependent reference voltage source 16 for providing a temperature-dependent reference voltage potential V_REF.

At its first capacitor electrode or its first capacitor pole or contact 18, the capacitor C is electrically connected to the temperature-independent current source 13. Furthermore, at its second capacitor electrode or its second capacitor pole or contact 20, the capacitor C is connected to the temperature-independent voltage source 14, so that the potential V_CONST is present at the second capacitor electrode 20.

The first switch contact 22 is electrically connected to the first capacitor electrode 18 and the second switch contact 24 is electrically connected to the second capacitor electrode 20.

Furthermore, the first capacitor electrode 22 is electrically connected to the first comparator input 26, so that the voltage potential V_C present at the first capacitor electrode 18 is present at the first comparator input 26. The second comparator input 28 is connected to the temperature-dependent voltage source 16, so that the temperature-dependent reference voltage potential V_REF is present at the second comparator input 28. The comparator output 30 is furthermore signal-connected to the switch S.

The construction of the temperature-independent voltage source 14 is described below.

The temperature-independent voltage source 14 comprises an impedance converter. The impedance converter comprises a voltage divider having the resistors R1 and R2. A temperature-independent voltage is divided by means of the resistors R1 and R2. The voltage present at the resistor R2 serves as first input of an operational amplifier OA1. The output of the operational amplifier OA1 is present at the second input of the operational amplifier OA1.

The construction of the temperature-dependent voltage source 16 will now be described in detail.

A temperature-dependent current I_TEMP is converted into a temperature-dependent voltage V_TEMP with the aid of a resistor R3. The temperature-dependent current I_TEMP is preferably the current of a bandgap circuit of the semiconductor memory device. Bandgap circuits are known multifariously in the prior art. "Halbleiterschaltungen" ["Semiconductor circuits"] by U. Tietze and Ch. Schenk, 10th Edition, pages 558–560, in particular FIG. 18.29 shows an exemplary bandgap circuit for generating a temperature-dependent current. The entire contents of this description of the bandgap circuit are considered to be disclosed herein.

The temperature-dependent voltage V_TEMP serves as input of an impedance converter 32.

The impedance converter comprises an operational amplifier OA2, at whose first input the temperature-dependent voltage VTEMP is present and at whose second input the output of the operational amplifier OA2 is present. The output signal of the impedance converter 32 is fed to an inverting amplifier 34.

The inverting amplifier 34 comprises an operational amplifier OA3 and resistors R4, R5, R6 and R7. The output signal of the impedance converter 32 passed via the resistor R6 is present at the first input. Furthermore, the output signal of the operational amplifier OA3 passed via the resistor R7 is present at the first input of the operational amplifier OA3. At the second input of the operational amplifier OA3, a voltage is present which has been obtained by means of a voltage divider having the resistors R4 and R5 and which is present at the resistor R5.

The operation of the device 10 according to the invention is described below.

The capacitor is charged by means of the current having the temperature-independent current intensity I_CONST. The comparator 12 compares the voltage potential V_C present at the first capacitor electrode 18 with the temperature-dependent voltage potential V_REF. If the capacitor voltage potential V_C reaches or exceeds the reference voltage potential V_REF, the comparator 12 outputs a refresh signal. The switch S is closed at the same time, so that the capacitor is discharged again. Afterward, the switch S is opened again and the above-described process proceeds anew. The capacitor C, the comparator 12 and the switch S thus essentially form a temperature-dependent oscillator for generating the refresh signal. The refresh signal is fed to a refresh device which refreshes the memory cell array. A refresh signal is output earlier or later depending on the magnitude of the reference voltage potential V_REF.

The time T_RS required to charge the capacitor C up to the reference voltage V_REF, and thus the time between two refresh signals, can be determined in accordance with equation (1).

$$T\_RS = \frac{C*(V\_REF - V\_CONST)}{I\_CONST} \quad (1)$$

Consequently, a virtually arbitrary relationship between the temperature and the period of the refresh signal can be obtained through suitable selection of V_CONST and I_CONST.

Having described the invention, and a preferred embodiment thereof, what we claim as new, and secured by letters patent is:

What is claimed is:

1. A circuit for generating a refresh signal for a memory cell, the circuit comprising:
    a temperature-independent current source;
    a temperature-independent voltage source;
    a temperature-dependent reference voltage source;
    a capacitor having
        a first terminal connected to the temperature-independent current source, and
        a second terminal connected to the temperature-independent voltage source; and
    a comparator having
        a first input connected to the first terminal of the capacitor; and
        a second input connected to the temperature-dependent reference voltage source, the comparator being configured to output the refresh signal in response to a difference between voltages present at the first and second inputs thereof.

2. The circuit of claim 1, further comprising a switch configured to reset the capacitor.

3. The circuit of claim 2, wherein the switch is in signal communication with the comparator, and wherein the switch is configured to reset the capacitor in response to outputting of a refresh signal by the comparator.

4. The circuit of claim 1, wherein the temperature-dependent reference voltage source comprises an impedance converter.

5. The circuit of claim 1, wherein the temperature-dependent reference voltage source comprises an inverting amplifier configured to amplify a reference voltage potential.

6. The circuit of claim 1, wherein the temperature-independent voltage source comprises an impedance converted configured to generate a temperature-independent voltage.

7. The circuit of claim 1, wherein the temperature-dependent reference voltage source is configured to convert a temperature-dependent current into a temperature-dependent voltage.

8. The circuit of claim 7, further comprising a bandgap circuit for providing the temperature-dependent current to the temperature-dependent voltage source.

9. The circuit of claim 1, wherein the memory cell comprises a DRAM memory cell.

10. A DRAM memory having a memory cell configured to be refreshed by the refresh signal generated by the circuit of claim 1.

11. The circuit of claim 1, wherein the comparator is configured to output the refresh signal when the voltage present at the first input exceeds the temperature dependent reference voltage present at the second input.

12. A method for generating a refresh signal for a memory cell, the method comprising:

setting a temperature-independent voltage at a second terminal of a capacitor;

providing a temperature-independent current at a first terminal of the capacitor;

outputting the refresh signal in response to a difference between the temperature-independent voltage and the temperature-dependent reference voltage.

13. The method of claim 12, further comprising discharging the capacitor concurrently with outputting the refresh signal.

14. The method of claim 12, wherein outputting the refresh signal comprises outputting the refresh signal when the temperature-independent voltage exceeds the temperature-dependent reference voltage.

15. A circuit for providing a refresh signal to a memory cell, the circuit comprising:

a temperature-dependent oscillator configured to periodically generate the refresh signal at a frequency that depends on a temperature of the memory cell, the temperature-dependent oscillator including a comparator, the comparator having;

a first input for receiving the signal indicative of the temperature of the memory cell, and a second input for receiving a temperature independent signal, and a capacitor configured to provide a signal to the second input of the comparator, the comparator being configured to generate the refresh signal in response to a difference between the signals presented at the first and second inputs thereof, and means for providing, to the oscillator, a signal indicative of the temperature of the memory cell.

16. The circuit of claim 15, wherein the oscillator further comprises a switch connected in parallel with the capacitor, the switch being momentarily closed to reset the capacitor when the comparator outputs the refresh signal.

* * * * *